US012004289B2

(12) United States Patent
Nagai

(10) Patent No.: US 12,004,289 B2
(45) Date of Patent: Jun. 4, 2024

(54) FLEXIBLE SUBSTRATE AND ELECTRONIC DEVICE

(71) Applicant: Murata Manufacturing Co., Ltd., Nagaokakyo (JP)

(72) Inventor: Tomohiro Nagai, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 554 days.

(21) Appl. No.: 17/227,426

(22) Filed: Apr. 12, 2021

(65) Prior Publication Data

US 2021/0235576 A1     Jul. 29, 2021

Related U.S. Application Data

(63) Continuation of application No. PCT/JP2019/044103, filed on Nov. 11, 2019.

(30) Foreign Application Priority Data

Nov. 14, 2018   (JP) ................. 2018-213675

(51) Int. Cl.
*H05K 1/02*     (2006.01)
*H01P 3/08*     (2006.01)
(Continued)

(52) U.S. Cl.
CPC ............. *H05K 1/0237* (2013.01); *H01P 3/08* (2013.01); *H01Q 1/12* (2013.01); *H01R 12/7076* (2013.01);
(Continued)

(58) Field of Classification Search
CPC .......... H01P 3/08; H01Q 1/12; H05K 1/0237; H05K 1/0277; H05K 1/148
See application file for complete search history.

(56) References Cited

U.S. PATENT DOCUMENTS 3,617,952 A * 11/1971 Beech ................. H01P 5/185
333/116
3,768,042 A * 10/1973 Friend ................. H01P 5/187
333/116
(Continued)

FOREIGN PATENT DOCUMENTS

JP    2012-080353 A    4/2012
JP    2014-033432 A    2/2014
(Continued)

OTHER PUBLICATIONS

Official Communication issued in International Patent Application No. PCT/JP2019/044103, mailed on Jan. 28, 2020.

*Primary Examiner* — Nathan Milakovich
(74) *Attorney, Agent, or Firm* — Keating & Bennett, LLP

(57) ABSTRACT

A flexible substrate includes a base substrate that has flexibility, connecting portions on the base substrate and connectible to an antenna substrate and a circuit substrate, and a first line and a second line at the base substrate and connected to the connecting portions. The first line and the second line include a first region in which the first line and the second line extend in parallel or substantially in parallel with each other, and a second region in which the first line and the second line are closer to each other than in the first region and coupled to each other, and the second region defines a directional coupler.

21 Claims, 14 Drawing Sheets

(51) Int. Cl.
  *H01Q 1/12*     (2006.01)
  *H01R 12/70*   (2011.01)
  *H01R 12/77*   (2011.01)
  *H01R 24/50*   (2011.01)

(52) U.S. Cl.
  CPC ............ *H01R 12/777* (2013.01); *H01R 24/50* (2013.01); *H05K 1/0277* (2013.01)

(56) References Cited

U.S. PATENT DOCUMENTS

| | | | | |
|---|---|---|---|---|
| 4,139,827 | A | * | 2/1979 | Russell .................... H01P 5/187 333/116 |
| 4,150,345 | A | * | 4/1979 | Goldman ................ H01P 5/185 333/116 |
| 5,939,952 | A | * | 8/1999 | Noda .................... H01B 7/0876 333/236 |
| 6,300,846 | B1 | * | 10/2001 | Brunker ............... H05K 1/0228 174/33 |
| 10,418,680 | B1 | * | 9/2019 | Podell ....................... H01P 3/08 |
| 2007/0161419 | A1 | | 7/2007 | Dakeya |
| 2009/0219213 | A1 | * | 9/2009 | Lee ......................... H01Q 1/521 343/700 MS |
| 2011/0121922 | A1 | * | 5/2011 | Blair ......................... H01P 3/00 333/238 |
| 2015/0207541 | A1 | | 7/2015 | Kuroda |
| 2015/0294781 | A1 | | 10/2015 | Yosui et al. |
| 2017/0237140 | A1 | * | 8/2017 | Dakhiya ............. H03F 3/45076 330/252 |
| 2019/0014655 | A1 | | 1/2019 | Yazaki et al. |
| 2020/0015351 | A1 | * | 1/2020 | Takano ................ H05K 3/4644 |
| 2021/0068268 | A1 | * | 3/2021 | Nagai .................. H05K 1/0215 |

FOREIGN PATENT DOCUMENTS

| | | |
|---|---|---|
| JP | 2016-015661 A | 1/2016 |
| JP | 2017-079449 A | 4/2017 |
| JP | 2017-208648 A | 11/2017 |
| WO | 2005/114778 A1 | 12/2005 |
| WO | 2010/150588 A1 | 12/2010 |
| WO | 2014/129279 A1 | 8/2014 |
| WO | 2017/179583 A1 | 10/2017 |

* cited by examiner

FLEXIBLE SUBSTRATE AND ELECTRONIC DEVICE

CROSS REFERENCE TO RELATED APPLICATIONS

This application claims the benefit of priority to Japanese Patent Application No. 2018-213675 filed on Nov. 14, 2018 and is a Continuation Application of PCT Application No. PCT/JP2019/044103 filed on Nov. 11, 2019. The entire contents of each application are hereby incorporated herein by reference.

BACKGROUND OF THE INVENTION

1. Field of the Invention

The present invention relates to a flexible substrate provided in an electronic device, and more particularly, to a flexible substrate including a coupling portion of a signal, and an electronic device including a flexible substrate.

2. Description of the Related Art

Conventionally, in a case in which a small electronic device, such as a mobile terminal, includes mounted circuits, such as a plurality of base substrates in a housing, the mounted circuits are connected to each other by a flat cable that has flexibility, as disclosed in International Publication No. 2005/114778, for example.

In addition, International Publication No. 2014/129279 discloses an inductor bridge including an inductor portion at an intermediate position of a line of a cable that connects the mounted circuits.

When the flat cable disclosed in International Publication No. 2005/114778 is used to configure an electronic device by providing a plurality of base substrates and connecting the plurality of base substrates to each other with a flat cable, the flat cable is used as a wiring that simply connects the base substrates to each other, and an electronic component is mounted on the base substrate, as required, so that a circuit is configured per base substrate.

The inductor bridge disclosed in International Publication No. 2014/129279 is used as a cable including, at an intermediate position of a line, an inductor that is connected in series to the line.

With the use of such a cable, it may be unnecessary to mount a circuit element on a mounted circuit, such as a circuit substrate, while the cable is stored in a limited space, which is effective for the miniaturization of the device.

However, in a cable with a conventional structure, a circuit element connected in series to a line is only provided, and, since such a circuit element is a lumped-parameter circuit element, any functionality other than adding a circuit element has not been able to be provided to the cable.

SUMMARY OF THE INVENTION

Preferred embodiments of the present invention provide flexible substrates that each allow a signal that propagates through a line to be indirectly inputted and outputted, and electronic devices each including such a flexible substrate.

A flexible substrate according to a preferred embodiment of the present invention includes a base substrate that has flexibility, a connecting portion on the base substrate and connectible to a mounted circuit, and a first line and a second line at the base substrate and connected to the connecting portion, and the first line and the second line include a first region in which the first line and the second line extend in parallel or substantially in parallel with each other, and a second region in which the first line and the second line are closer to each other than in the first region and coupled to each other, and a length of each of the first line and the second line in the second region is equal or substantially equal to one quarter of a wavelength of a signal that propagates through the first line and the second line.

A flexible substrate according to a preferred embodiment of the present invention includes a base substrate that has flexibility, a connecting portion on the base substrate and connectible to a mounted circuit, and a first line and a second line at the base substrate and connected to the connecting portion, and the first line and the second line include a first region in which the first line and the second line extend in parallel or substantially in parallel with each other, and a second region in which the first line and the second line are closer to each other than in the first region and coupled to each other, and the first region includes an interlayer connection conductor between the first line and the second line.

A flexible substrate according to a preferred embodiment of the present invention includes a base substrate that is at least partially bent, a connecting portion on the base substrate and connectible to a mounted circuit, and a first line and a second line at the base substrate and connected to the connecting portion, and the first line and the second line include a first region in which the first line and the second line extend in parallel or substantially in parallel with each other, and a second region in which the first line and the second line extend in parallel or substantially in parallel with each other, and a maximum distance between the first line and the second line in the second region is smaller than a maximum distance between the first line and the second line in the first region.

According to various preferred embodiments of the present invention, flexible substrates that each define and function as a cable capable of indirectly inputting and outputting a signal that propagates through a line, and electronic devices each including such a flexible substrate are provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
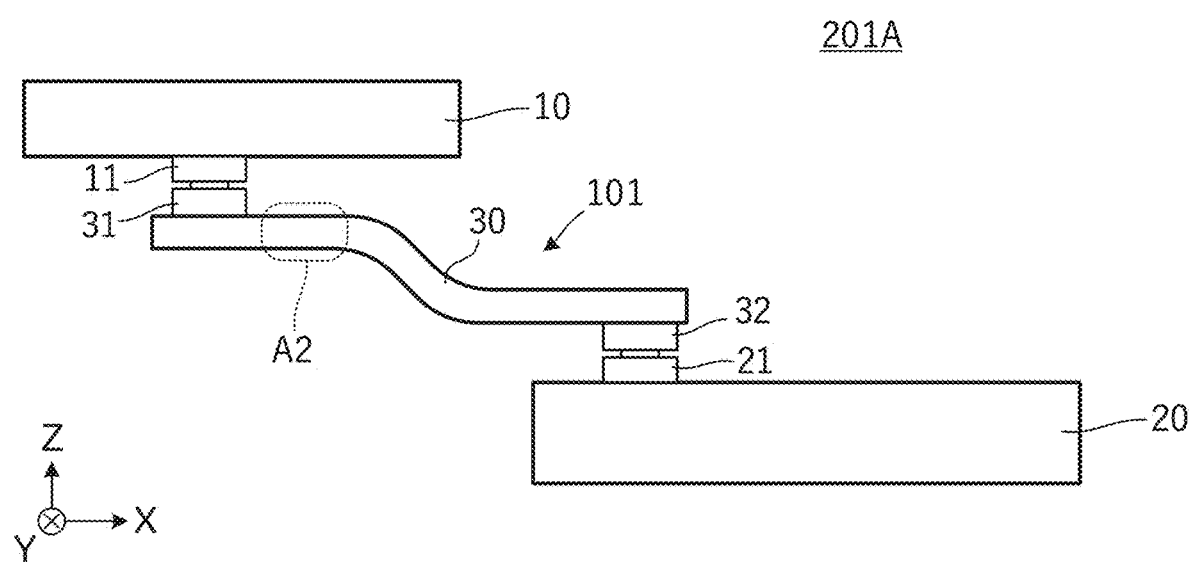
FIG. 1 is a front view of a flexible substrate 101 and a main portion of an electronic device 201A including the flexible substrate 101 according to a first preferred embodiment of the present invention.

Flexible substrates and electronic devices according to preferred embodiments of the present invention are described below.

A flexible substrate according to a preferred embodiment of the present invention includes a base substrate that has flexibility, a connecting portion that is provided on the base substrate and connectible to a mounted circuit, and a first line and a second line that are provided at the base substrate and connected to the connecting portion, and the first line and the second line include a first region in which the first line and the second line extend in parallel or substantially in parallel with each other, and a second region in which the first line and the second line are closer to each other than in the first region and coupled to each other.

With the above configuration, the first region defines and functions as a transmission line portion, the second region defines and functions as a coupled line portion, and a signal that propagates through the first line and the second line is indirectly inputted or outputted according to coupling between lines in the second region.

In a flexible substrate according to a preferred embodiment of the present invention, a length of a portion in which the first line and the second line are close to each other in the second region may be about a quarter wavelength of a wavelength of a signal that propagates through the first line and the second line. According to such a structure, the second region defines and functions as a directional coupler.

In a flexible substrate according to a preferred embodiment of the present invention, the base substrate may include a stacked body including a plurality of insulating base material layers that are stacked on each other, and a thickness of the second region may be larger than a thickness of the first region. According to such a structure, the structural rigidity of the second region is increased and a function as the coupled line portion is stabilized.

In a flexible substrate according to a preferred embodiment of the present invention, the second region may be a region in which the first line and the second line are close to each other in stages. According to such a structure, reflection of a signal due to impedance mismatching on a boundary between the first region and the second region is significantly reduced or prevented.

In a flexible substrate according to a preferred embodiment of the present invention, the base substrate may include an antenna portion that is electrically connected to the first line or the second line. According to such a structure, the flexible substrate is able to be used as a structure in which even the antenna portion is integrated together with the transmission line portion that inputs and outputs a signal to the antenna portion.

An electronic device according to a preferred embodiment of the present invention includes a flexible substrate, a first mounted circuit, and a second mounted circuit, and the first mounted circuit and the second mounted circuit are connected to each other through the flexible substrate, and the flexible substrate includes a base substrate that has flexibility, a first connecting portion that is provided on the base substrate and connected to the first mounted circuit, a second connecting portion that is provided on the base substrate and connected to the second mounted circuit, a first line that is provided at the base substrate and connected to the first connecting portion, and a second line that is provided at the base substrate and connected to the second connecting portion, and the first line and the second line include a first region in which the first line and the second line extend in parallel or substantially in parallel with each other, and a second region in which the first line and the second line are closer to each other than in the first region and coupled to each other.

According to such a structure, a signal that propagates through the first line and the second line is indirectly inputted or outputted according to coupling between lines in the second region.

In an electronic device according to a preferred embodiment of the present invention, the first mounted circuit may be an antenna substrate that includes an antenna, and the second mounted circuit may be a circuit substrate. In such a structure, the circuit substrate including a transmitting circuit or a receiving circuit and the antenna substrate are structured to be connected to each other through the flexible substrate, which makes it possible to configure a small electronic device that includes an antenna.

In an electronic device according to a preferred embodiment of the present invention, the second region may be provided at a position closer to the antenna substrate than to the circuit substrate. According to such a structure, the electric power of a signal transmitted from the antenna is able to be detected with higher accuracy.

Hereinafter, preferred embodiments of the present invention will be described in detail with reference to the attached drawings and several specific examples. In the drawings, components and elements assigned with the same reference numerals or symbols will represent identical or substantially identical components and elements. While preferred embodiments of the present invention are divided and described for the sake of convenience in consideration of ease of description or understanding of main points, elements described in different preferred embodiments are able to be partially replaced and combined with each other. In the second and subsequent preferred embodiments, a description of matters common to the first preferred embodiment will be omitted and only different points will be described. In particular, the same advantageous functions and effects by the same configurations will not be described one by one for each preferred embodiment.

First Preferred Embodiment

FIG. 1 is a front view of a flexible substrate 101 and a main portion of an electronic device 201A including the flexible substrate 101 according to a first preferred embodiment of the present invention. The electronic device 201A includes a flexible substrate 101, an antenna substrate 10, and a circuit substrate 20. The flexible substrate 101 includes a base substrate 30 that has flexibility, and plugs 31 and 32. As will be described below, the base substrate 30 includes a first line, a second line, a transmission line portion, and a coupled line portion.

An antenna element defined by a conductor pattern is provided on the antenna substrate 10. The high-frequency circuit connected to the antenna element is provided on the circuit substrate 20.

A receptacle 11 connected to the antenna element is mounted on the antenna substrate 10. A receptacle 21 connected to the high-frequency circuit is mounted on the circuit substrate 20. The receptacle 11 and the plug 31 define one coaxial connector. Similarly, the receptacle 21 and the plug 32 define one coaxial connector. The plugs 31 and 32 each correspond to a "connecting portion". In addition, the plug 31 corresponds to a "first connecting portion", and the plug 32 corresponds to a "second connecting portion".

The antenna substrate 10 corresponds to a "first mounted circuit", and the circuit substrate 20 corresponds to a "second mounted circuit".

Figure 2:
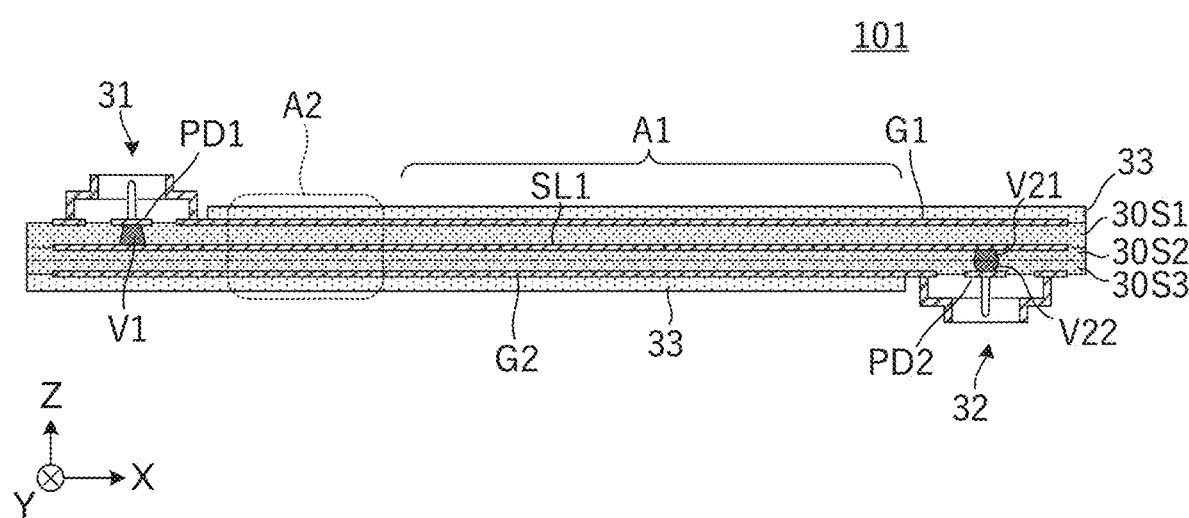
FIG. 2 is a vertical cross-sectional view of the flexible substrate 101.

FIG. 2 is a vertical cross-sectional view of the flexible substrate 101. The flexible substrate 101 includes a stacked body of insulating base materials 30S1, 30S2, and 30S3 each on which a conductor pattern is provided. The base materials 30S1, 30S2, and 30S3 are each preferably a thermoplastic resin sheet material, such as a liquid crystal polymer, for example. A pad PD1 and a ground conductor G1 are provided on the upper surface of the base material 30S1, and a first line pattern SL1 is provided on the upper surface of the base material 30S2. A pad PD2 and a ground conductor G2 are provided on the lower surface of the base material 30S3. Although not shown in FIG. 2, for FIG. 2 is a vertical cross-sectional view at a position along the first line pattern SL1, a second line pattern (a second line pattern SL2 to be shown below) is also provided on the base material 30S2. The first line pattern SL1, the second line pattern SL2, and the ground conductors G1 and G2 are defined by patterning, for example, a Cu foil laminated on the base material. The first line pattern SL1 and the ground conductors G1 and G2 that interpose the first line pattern SL1 in a stacking direction define the first line having a stripline structure. Similarly, the second line pattern SL2 and the ground conductors G1 and G2 that interpose the second line pattern SL2 in the stacking direction define the second line having a stripline structure. As will be described below, the flexible substrate 101 includes a coupled line portion A2. The coupled line portion A2 is not defined by the flexible substrate 101 on which a component is mounted, but is defined by the flexible substrate 101 itself.

A via conductor V1 that connects the first line pattern SL1 and the pad PD1 is provided in the base material 30S1. Via conductors V21 and V22 that connect the first line pattern SL1 and the pad PD2 are respectively provided in the base materials 30S2 and 30S3. The via conductors V1, V21, and V22 are interlayer connection conductors configured such that, for example, a conductive filler including Sn filler or conductive paste including a resin material and flux is filled in a via hole and is solidified by heating and pressing.

It is to be noted that, although FIG. 1 and FIG. 2 show an example in which the flexible substrate 101 is connected to the antenna substrate 10 and the circuit substrate 20 through the plugs 31 and 32, the flexible substrate 101 may be connected to another base substrate without the plugs 31 and 32 interposed therebetween. For example, the flexible substrate 101 may be directly connected to the circuit substrate 20 that has rigidity. When a plug is used for a connecting portion, connection strength is able to be increased, and, when a plug is not used, the electronic device 201A defined by the antenna substrate 10, the flexible substrate 101, and the circuit substrate 20 is able to achieve space saving by the space of the plug.

The plugs 31 and 32 are mounted on the surface of the stacked body. The center conductor (a pin) of the plug 31 is electrically connected to the pad PD1, and the outer conductor of the plug 31 is electrically connected to the ground conductor G1. In addition, the center conductor (a pin) of the plug 32 is electrically connected to the pad PD2, and the outer conductor of the plug 32 is electrically connected to the ground conductor G2.

A region of the stacked body other than positions at which the plugs 31 and 32 are mounted is covered with a resist film 33, such as epoxy or polyimide, for example.

Figure 3:
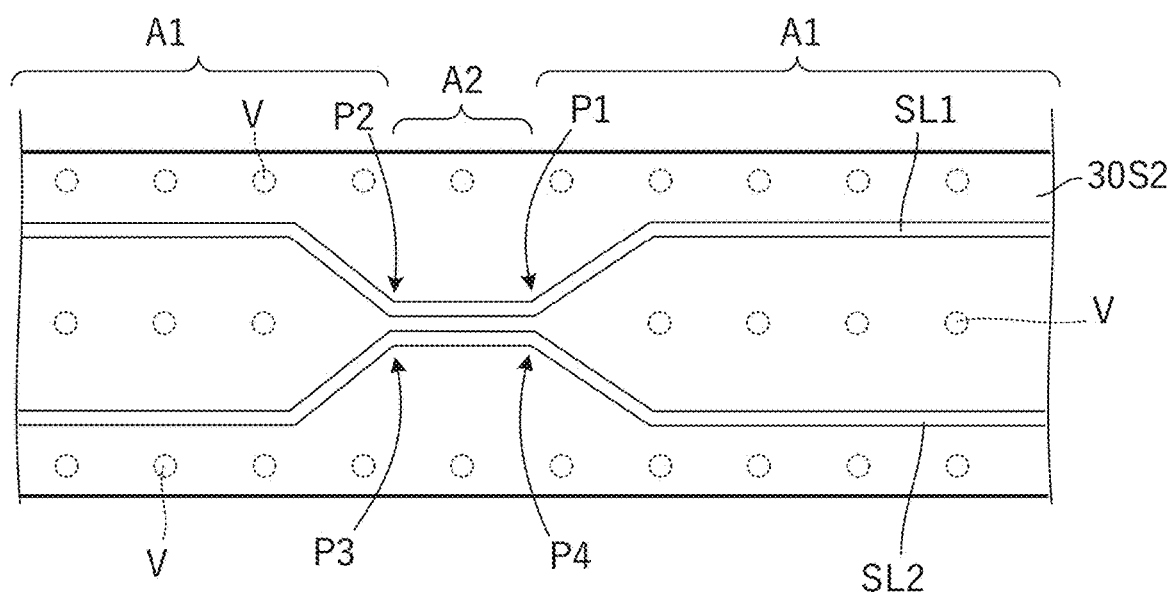
FIG. 3 is a plan view of a base material 30S2 in the flexible substrate.
Figure 3:
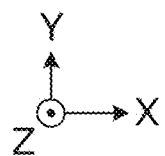

FIG. 3 is a plan view of the base material 30S2. The first line pattern SL1 and the second line pattern SL2 are provided on the base material 30S2. The first line pattern SL1 and the second line pattern SL2 include a transmission line portion A1 in which the first line pattern SL1 and the second line pattern SL2 extend in parallel or substantially in parallel with each other, and a coupled line portion A2 in which the first line pattern SL1 and the second line pattern SL2 are closer to each other than in the transmission line portion A1 and coupled to each other. In other words, the first line pattern SL1 and the second line pattern SL2 include the transmission line portion A1 in which the first line pattern SL1 and the second line pattern SL2 extend in parallel or substantially in parallel with each other, and the coupled line portion A2 in which the first line pattern SL1 and the second line pattern SL2 extend in parallel or substantially in parallel with each other, and the maximum distance between the first line pattern SL1 and the second line pattern SL2 in the coupled line portion A2 is smaller than the maximum distance between the first line pattern SL1 and the second line pattern SL2 in the transmission line portion A1.

The transmission line portion A1 corresponds to the "first region", and the coupled line portion A2 corresponds to the "second region". A length of a portion in which the first line pattern SL1 and the second line pattern SL2 in the coupled line portion A2 are close to each other is about a quarter wavelength of a wavelength of a signal that propagates through the first line pattern SL1 and the second line pattern SL2. However, a deviation due to a measurement error or the like is allowed. According to such a structure, the coupled line portion A2 defines and functions as a directional coupler.

In a plan view, a plurality of via conductors V that connect the ground conductors G1 and G2 shown in FIG. 2 are arrayed on the both side portions of the flexible substrate 101. In addition, in the transmission line portion A1, in the plan view, a plurality of via conductors V that connect the ground conductors G1 and G2 are arrayed also between the first line pattern SL1 and the second line pattern SL2. The via conductors V are not arrayed between the first line pattern SL1 and the second line pattern SL2 of the coupled line portion A2. As described above, the via conductors V with ground potential are provided between the first line pattern SL1 and the second line pattern SL2 in the transmission line portion A1, so that unwanted coupling between the first line and the second line in the transmission line portion A1 is significantly reduced or prevented.

As shown in FIG. 3, when a boundary between the transmission line portion A1 and the coupled line portion A2 is indicated by ports P1 to P4, a portion of an input signal (incident waves) to the port P1 appears in the port P2, and the remainder appears in the port P4. The signal strength that appears in the port P2 and the signal strength that appears in the port P4 are determined according to the degree of coupling of the coupled line portion A2. In addition, a signal with strength proportional to reflected waves from the coupled line portion A2 to the port P1 appears in the port P3.

When the electric power of an input signal to the port P1 is indicated by Pi, the electric power of a signal that appears in the port P4 is indicated by pi, and the electric power of a reflection signal that is outputted from the port P3 is indicated by pr, the degree of coupling C is expressed by C=10 log Pi/pi, and the directivity D is expressed by D=10 log Pi/pr.

For example, when the degree of coupling between the first line pattern SL1 and the second line pattern SL2 in the transmission line portion A1 and the degree of coupling between the first line pattern SL1 and the second line pattern SL2 in the coupled line portion A2 are measured by using the degree of coupling C, the degree of coupling in the coupled line portion A2 is larger than the degree of coupling in the transmission line portion A1. Specifically, the degree of coupling C in the coupled line portion A2 is C=about 10 dB to about 40 dB, for example.

As will be illustrated below, a transmission signal propagates through the first line including the first line pattern SL1, is inputted to the port P1, and is outputted from the port P2. The signal outputted from the port P2 is led to an antenna. The signal that propagates from the port P4 of the coupled line portion A2 through the second line including the second line pattern SL2 is treated as a monitoring signal of the electric power outputted to the antenna.

As shown in FIG. 1, the coupled line portion A2 is provided at a position closer to the antenna substrate 10 than to the circuit substrate 20. According to such a structure, since the strength of a transmission signal supplied to the antenna element of the antenna substrate 10 is detected immediately adjacent to the antenna element, the electric power of a signal sent from the antenna is able to be detected with higher accuracy.

Figure 4:
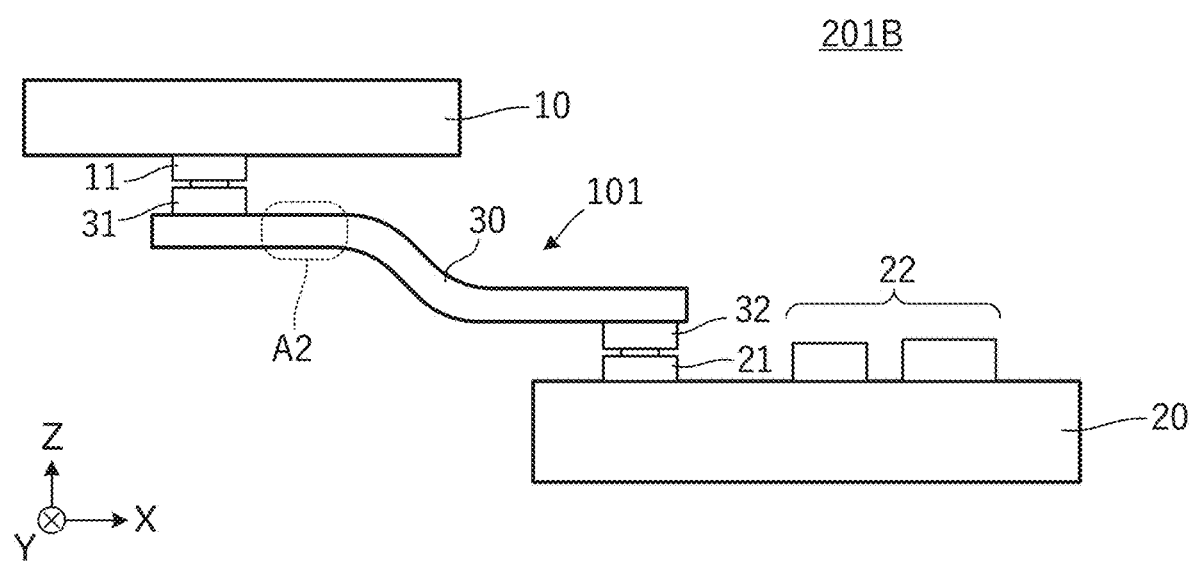
FIG. 4 is a front view of a main portion of a different electronic device 201B according to the first preferred embodiment of the present invention.

FIG. 4 is a front view of a main portion of a different electronic device 201B according to the first preferred embodiment of the present invention. The electronic device 201B includes a flexible substrate 101, an antenna substrate 10, and a circuit substrate 20. The configuration of the flexible substrate 101 is the same or substantially the same as the configuration of the flexible substrate 101 shown in FIG. 1.

A mounted component 22, in addition to the receptacle 21, is mounted on the circuit substrate 20. Examples of the mounted component 22 may include an amplifier, a duplexer, and an RFIC that will be described below.

According to preferred embodiments of the present invention, it is unnecessary to provide a directional coupler on the antenna substrate 10 or the circuit substrate 20, so that not only is the overall miniaturization achieved but also a special cable for transmitting a signal through the directional coupler, between the antenna substrate 10 and the circuit substrate 20 is not required. In addition, a loss at the connecting portion of the cable is also prevented.

Moreover, the flexible substrate according to preferred embodiments of the present invention is able to be used by being partially or entirely bent so as to avoid a housing or peripheral members, for example, so as to be disposed along a gap. In other words, the flexible substrate according to preferred embodiments of the present invention is a base substrate with at least partial bending. In addition, the flexible substrate according to preferred embodiments of the present invention, since being integrally made of a thermoplastic resin, is able to be plastically deformed by heating. Therefore, the bending is also facilitated.

Figure 5:
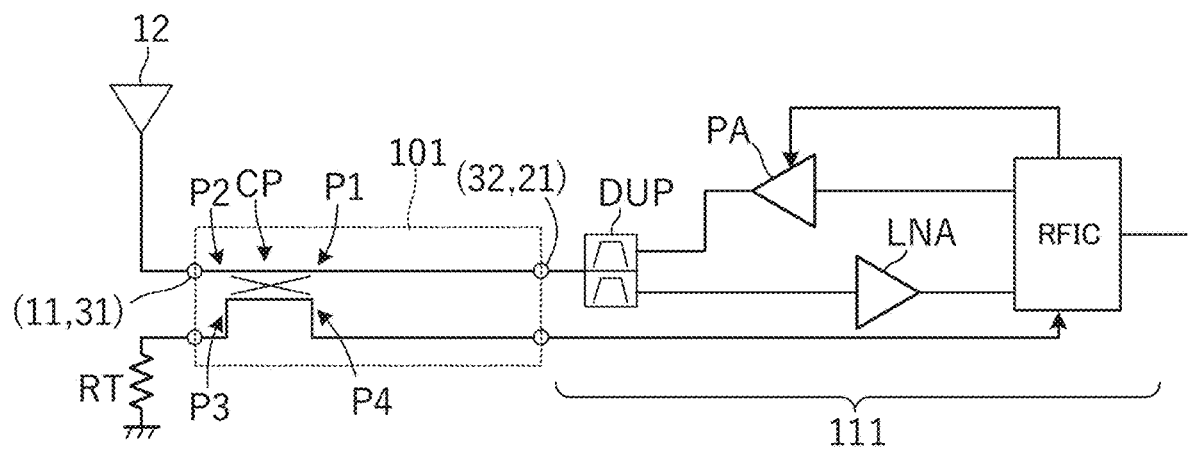
FIG. 5 is a block diagram showing a configuration of the electronic device 201B.

FIG. 5 is a block diagram showing a configuration of the electronic device 201B. The electronic device 201B includes a transmitter-receiver circuit 111, an antenna 12, and a flexible substrate 101 that connects the transmitter-receiver circuit 111 and the antenna 12. The antenna 12 is provided on the antenna substrate 10 shown in FIG. 4. A termination resistor RT is provided on the antenna substrate 10. The transmitter-receiver circuit 111 is provided on the circuit substrate 20.

In FIG. 5, the directional coupler provided in the flexible substrate 101 is indicated by CP. Ports P1 to P4 correspond to the ports P1 to P4 shown in FIG. 3. In this example, the port P3 is terminated by the termination resistor RT.

The transmitter-receiver circuit 111 includes a power amplifier PA, a duplexer DUP, a low noise amplifier LNA, and an RFIC. The RFIC defines and functions as a modem.

The receptacle 21 of the circuit substrate 20 is connected to a common port of the duplexer DUP. A transmission signal outputted from the power amplifier PA is inputted to a transmission signal input port of the duplexer DUP. The low noise amplifier LNA amplifies a reception signal outputted from a reception signal output port of the duplexer DUP.

The RFIC outputs a transmission signal and a gain control signal to the power amplifier PA. In addition, the RFIC receives an input of a reception signal outputted from the low noise amplifier LNA. Further, the RFIC receives an input of a signal outputted from the port P4 of the directional coupler CP of the flexible substrate 101, and controls the gain of the power amplifier PA according to the strength thereof. In short, since the electric power of the signal outputted from the port P4 of the directional coupler CP is proportional to the transmission power outputted to the antenna 12, the gain of the power amplifier PA is adjusted so that the electric power may be a predetermined value.

Figure 6:
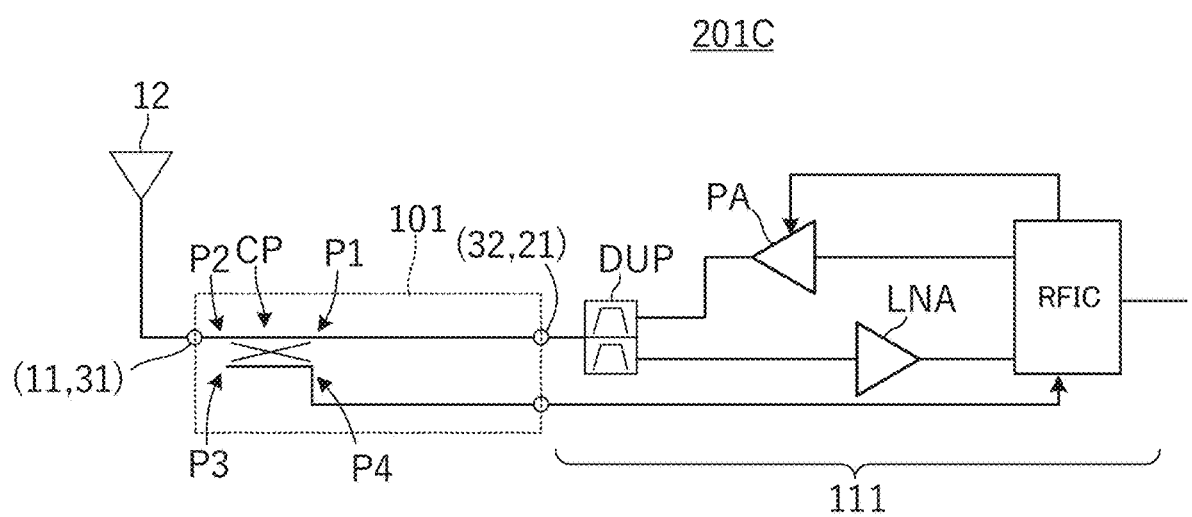
FIG. 6 is a block diagram showing a configuration of an electronic device 201C according to a preferred embodiment of the present invention.
Figure 7:
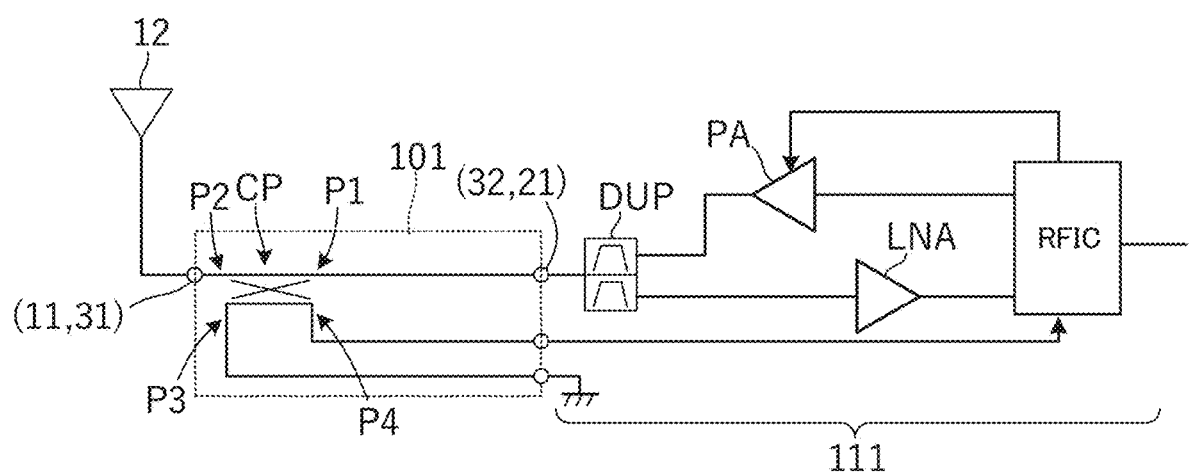
FIG. 7 is a block diagram showing a configuration of an electronic device 201D according to a preferred embodiment of the present invention.
Figure 8:
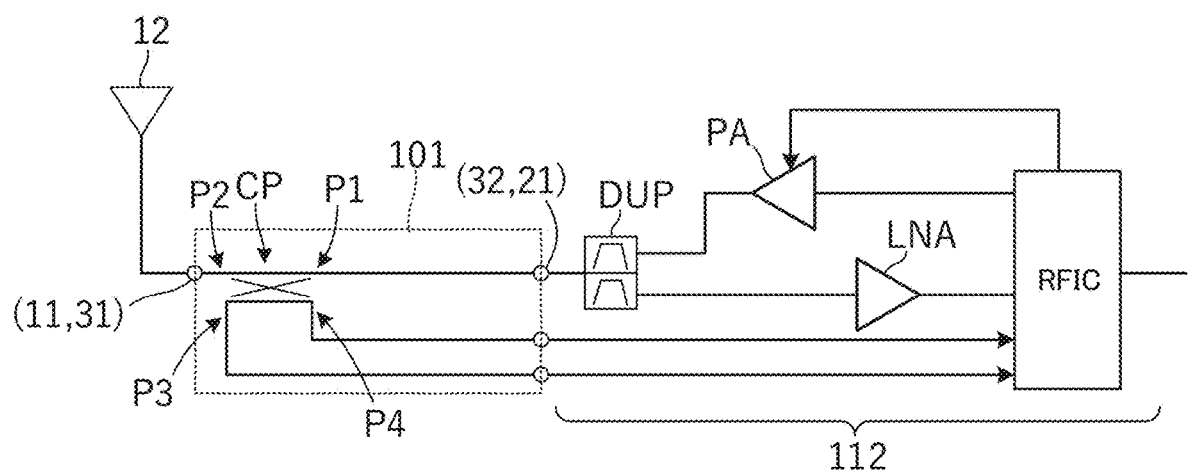
FIG. 8 is a block diagram showing a configuration of an electronic device 201E according to a preferred embodiment of the present invention.

FIG. 6 to FIG. 8 are block diagrams of an electronic device of which the configuration is partially different from the configuration of the electronic device 201B shown in FIG. 5.

In an electronic device 201C shown in FIG. 6, the port P3 of the directional coupler CP shown in FIG. 5 is open. Other configurations are the same or substantially the same as the configurations of the electronic device 201B. Although a reflection signal from the port P3 of the directional coupler CP is transmitted from the port P4 toward the RFIC, in a case in which the strength thereof does not cause a problem, the port P3 may be made open without being necessarily terminated by a resistor.

An electronic device 201D shown in FIG. 7 is configured so as to return a signal outputted from the port P3 of the directional coupler CP shown in FIG. 5, to the transmitter-receiver circuit 111. The port P3 of the directional coupler CP is grounded. Other configurations are the same or substantially the same as the configurations of the electronic device 201B. As described above, although a reflection signal from the port P3 of the directional coupler CP is transmitted from the port P4 toward the RFIC, in a case in which the strength thereof does not cause a problem, the port P3 may be grounded without being necessarily terminated by a resistor. In addition, in a case in which a grounding portion is not provided on an antenna substrate (the antenna substrate 10 in FIG. 1), as this example shows, the port P3 may be grounded on a side of the circuit substrate (the circuit substrate 20 in FIG. 1). Alternatively, the port P3 may be terminated by a resistor on the side of the circuit substrate.

An electronic device 201E shown in FIG. 8 includes a transmitter-receiver circuit 112, an antenna 12, and a flexible substrate 101 that connects the transmitter-receiver circuit 112 and the antenna 12. The electronic device 201E is configured so as to return a signal outputted not only from the port P4 of the directional coupler CP but also from the port P3, to the transmitter-receiver circuit 112.

In the electronic device 201E, the RFIC receives an input of the signal outputted from the port P4 of the directional coupler CP, and, as described above, adjusts the gain of the power amplifier PA according to the strength thereof. In addition, the RFIC detects the strength of a reflection signal that returns from the antenna 12 to the directional coupler CP, according to the strength of the signal outputted from the port P3 of the directional coupler CP.

The RFIC receives an input of the signal outputted from the port P3 of the directional coupler CP, and also controls the gain of the power amplifier PA according to the strength thereof. In short, since the electric power of the signal outputted from the port P3 of the directional coupler CP is proportional to the electric power of reflected waves due to impedance mismatching between the antenna 12 and space, the gain of the power amplifier PA is adjusted also according to reflection strength from the antenna 12.

Second Preferred Embodiment

A second preferred embodiment of the present invention describes an example of a flexible substrate including an antenna portion, and an electronic device including such a flexible substrate.

Figure 9:
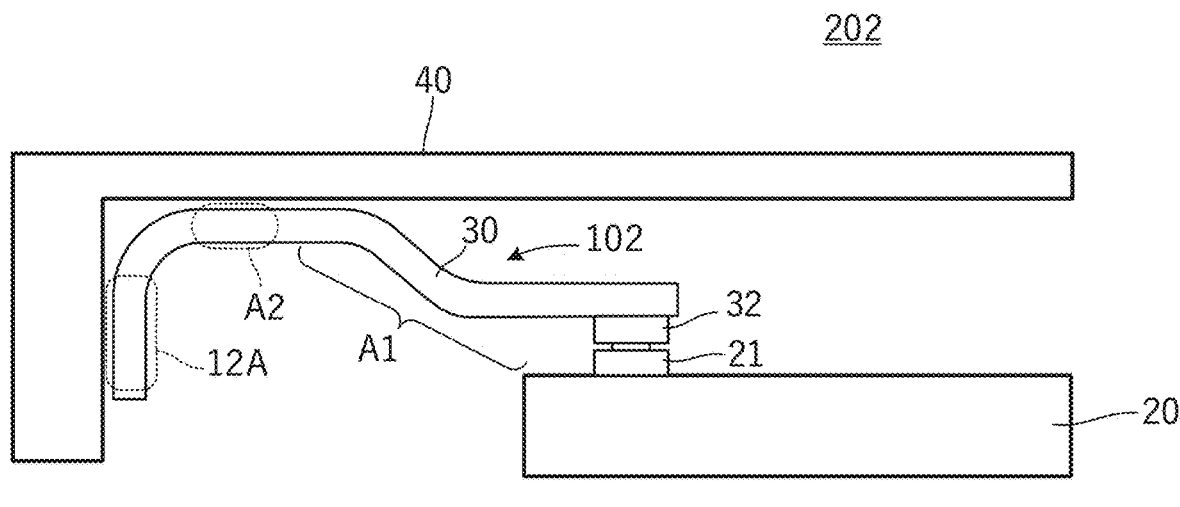
FIG. 9 is a front view of a main portion of an electronic device 202 according to a second preferred embodiment of the present invention.
Figure 9:
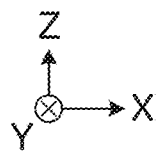

FIG. 9 is a front view of a main portion of an electronic device 202 according to the second preferred embodiment of the present invention. The electronic device 202 includes a flexible substrate 102 and a circuit substrate 20. The flexible substrate 102 includes a base substrate 30 that has flexibility, and a plug 32. The base substrate 30 includes a first line, a second line, a transmission line portion A1, and a coupled line portion A2 that are similar to the example described in the first preferred embodiment. The base substrate 30 further includes an antenna portion 12A. The antenna portion 12A is an antenna element defined by a conductor pattern, and is the same or substantially the same as the conductor pattern provided on the antenna substrate 10 in the first preferred embodiment.

As shown in FIG. 9, the antenna portion 12A and the coupled line portion A2 are disposed along the inner surface of an insulating housing 40 of the electronic device 202. The antenna portion 12A and the coupled line portion A2 may be connected to the inner surface of the housing 40 of the electronic device 202. As a result, while the base substrate 30 is flexible, the shape of the antenna portion 12A and the shape of the coupled line portion A2 are stabilized.

A high-frequency circuit connected to the antenna portion 12A is provided on the circuit substrate 20, and a receptacle 21 connected to the high-frequency circuit is mounted on the circuit substrate 20. The receptacle 21 and the plug 32 define one coaxial connector.

Figure 10:
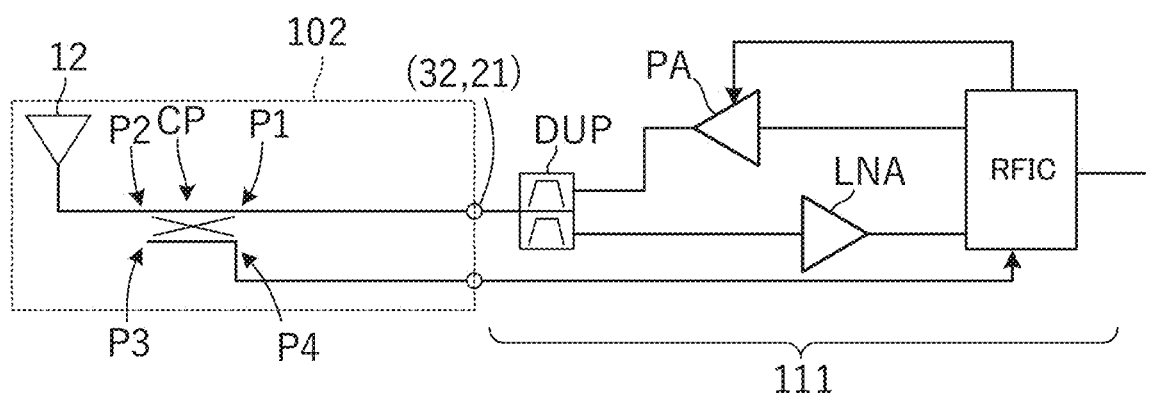
FIG. 10 is a block diagram showing a configuration of the electronic device 202.

FIG. 10 is a block diagram showing a configuration of the electronic device 202 according to the second preferred embodiment of the present invention. The electronic device 202 includes a transmitter-receiver circuit 111 and a flexible substrate 102. The antenna 12 corresponds to the antenna portion provided on or in the flexible substrate 102. The transmitter-receiver circuit 111 is provided on the circuit substrate 20.

As shown in FIG. 10, a directional coupler CP is provided in the flexible substrate 102. Ports P1 to P4 correspond to the ports P1 to P4 shown in FIG. 3. In this example, a port P3 is open. The configuration of the transmitter-receiver circuit 111 is as shown mainly in FIG. 5.

Third Preferred Embodiment

A third preferred embodiment of the present invention shows an example of a flexible substrate that is different in structure from the flexible substrate 101 described in the first preferred embodiment, and an electronic device including such a flexible substrate.

Figure 11A:
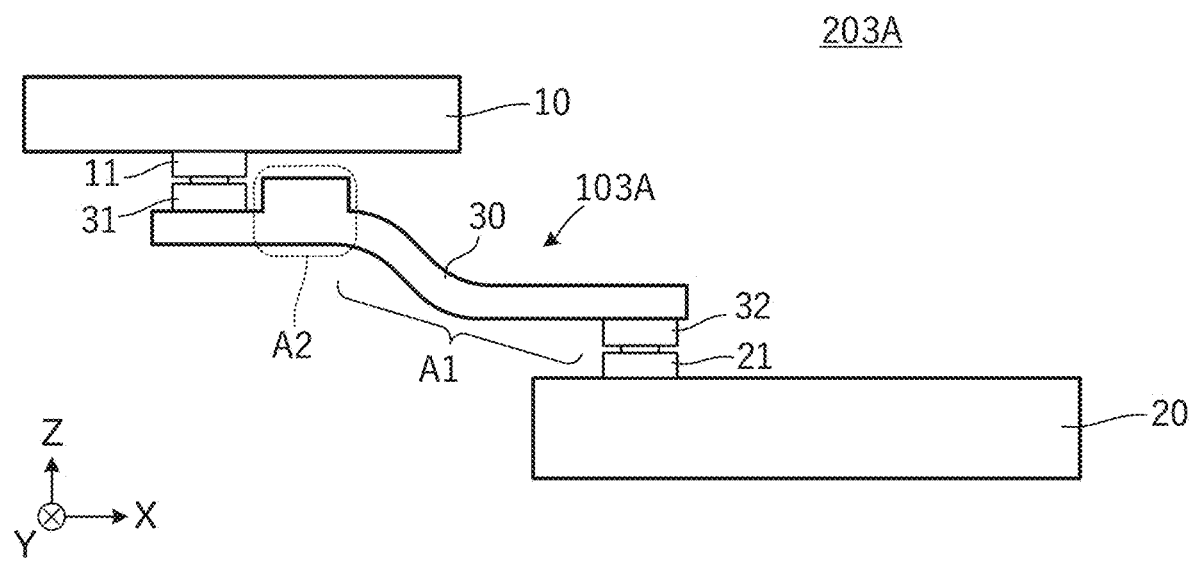
FIGS. 11A and 11B are front views of a main portion of electronic devices 203A and 203B according to a third preferred embodiment of the present invention.
Figure 11B:
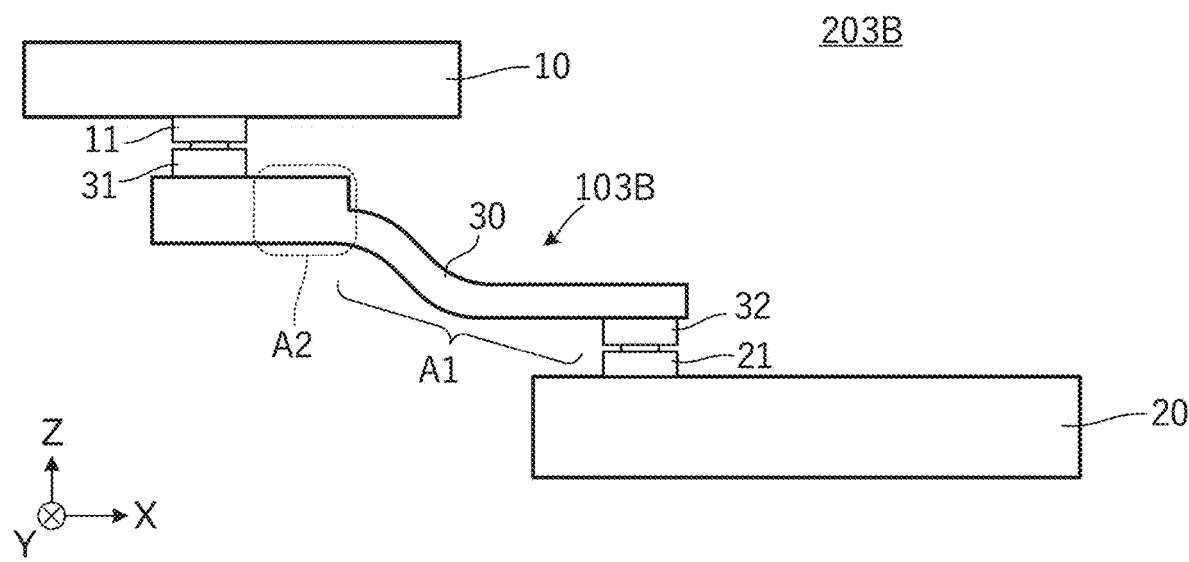

FIGS. 11A and 11B are front views of a main portion of electronic devices 203A and 203B according to the third preferred embodiment of the present invention. The electronic device 203A includes a flexible substrate 103A, an antenna substrate 10, and a circuit substrate 20. In addition, the electronic device 203B includes a flexible substrate 103B, an antenna substrate 10, and a circuit substrate 20.

Although the basic configurations of the flexible substrates 103A and 103B are the same or substantially the same as the configuration of the flexible substrate 101 shown in FIG. 1, the thickness of the coupled line portion A2 is larger than the thickness of the transmission line portion A1. According to such a structure, since the coupled line portion A2 has high structural rigidity, its characteristics as a directional coupler have high stability. In particular, in the flexible substrate 103B shown in FIG. 11B, the thickness of a region in which the plug 31 is mounted is also larger than the thickness of the transmission line portion A1. According to such a structure, since the connecting portion to the antenna substrate 10 also has high structural rigidity, the characteristics as a directional coupler have higher stability.

Fourth Preferred Embodiment

A fourth preferred embodiment of the present invention describes another structural example of a directional coupler provided in a flexible substrate.

Figure 12:
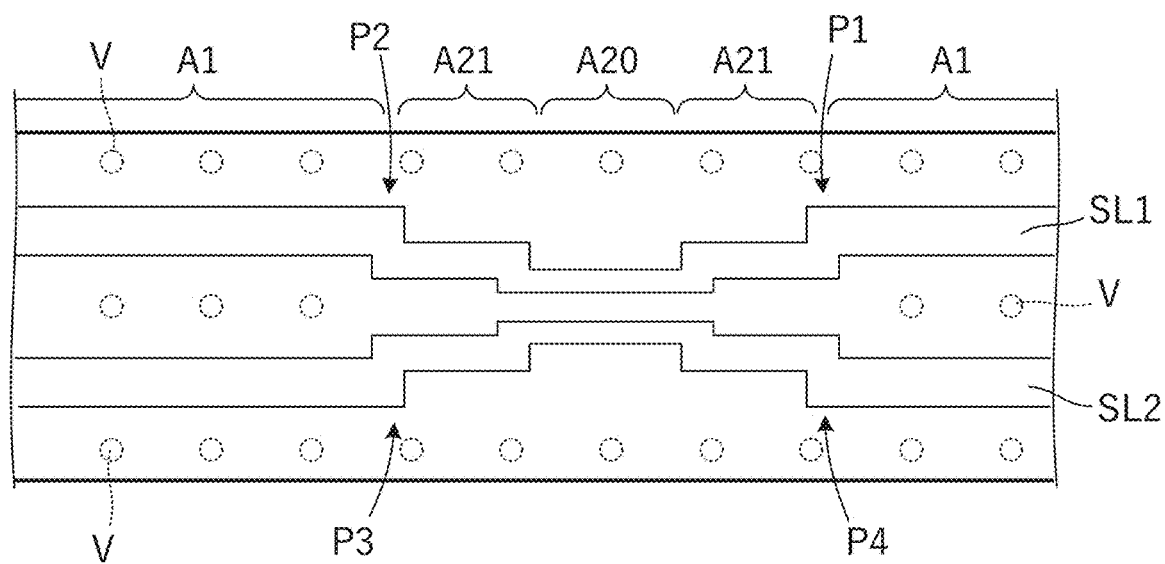
FIG. 12 is a plan view of a predetermined base material of a flexible substrate according to a fourth preferred embodiment of the present invention, and is, in particular, a plan view of a region in which a directional coupler is provided.
Figure 12:
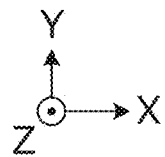

FIG. 12 is a plan view of a base material of a flexible substrate according to the fourth preferred embodiment of the present invention, and is, in particular, a plan view of a region in which a directional coupler is provided. A first line pattern SL1 and a second line pattern SL2 are provided on the base material. The first line pattern SL1 and the second line pattern SL2 include a transmission line portion A1 in which the first line pattern SL1 and the second line pattern SL2 extend in parallel or substantially in parallel with each other, and coupled line portions A20 and A21 in which the first line pattern SL1 and the second line pattern SL2 are closer to each other than in the transmission line portion A1 and coupled to each other. In other words, the first line pattern SL1 and the second line pattern SL2 the transmission line portion A1 in which the first line pattern SL1 and the second line pattern SL2 extend in parallel or substantially in parallel with each other, and the coupled line portions A20 and A21 in which the first line pattern SL1 and the second line pattern SL2 extend in parallel or substantially in parallel with each other, and the maximum distance between the first line pattern SL1 and the second line pattern SL2 in the coupled line portions A20 and A21 is smaller than the maximum distance between the first line pattern SL1 and the second line pattern SL2 in the transmission line portion A1. The transmission line portion A1 corresponds to the "first region", and the coupled line portions A20 and A21 correspond to the "second region".

A length of a portion in which the first line pattern SL1 and the second line pattern SL2 are close to each other in the coupled line portion A20 is about a quarter wavelength of a wavelength of a signal that propagates through the first line pattern SL1 and the second line pattern SL2. Similarly, a length of a portion in which the first line pattern SL1 and the second line pattern SL2 are close to each other in the coupled line portion A21 is also about a quarter wavelength. However, a deviation due to a measurement error or the like is allowed. According to such a structure, the coupled line portions A20 and A21 that are coupled in multiple stages define and function as a directional coupler.

The line width of the first line pattern SL1 and the second line pattern SL2 in the coupled line portion A21 is smaller than the line width of the first line pattern SL1 and the second line pattern SL2 in the transmission line portion A1. In addition, the line width of the first line pattern SL1 and the second line pattern SL2 in the coupled line portion A20 is smaller than the line width of the first line pattern SL1 and the second line pattern SL2 in the coupled line portion A21.

The directional coupler according to the present preferred embodiment has a structure in which a line space of the coupled line portion varies in stages, so that the frequency band in which it acts as a directional coupler is increased. In short, the directional coupler has small frequency dependence, and defines and functions as a directional coupler over a wide band. In addition, with the structure in which the line width is smaller as the line space is smaller, the characteristic impedance of the first line and the second line is able to be approximated to a constant value, and the reflection of a signal in the directional coupler is significantly reduced or prevented.

Since such a coupled line portion requires a predetermined length, mounting an element that has a coupled line function on a circuit substrate requires a large space to mount the element. In preferred embodiments of the present invention, the coupled line portion is provided in the flexible substrate, the entire length of which is relatively long, so that the space saving is able to be achieved as a whole.

Fifth Preferred Embodiment

A fifth preferred embodiment of the present invention describes another structural example of a directional coupler provided in a flexible substrate.

Figure 13A:
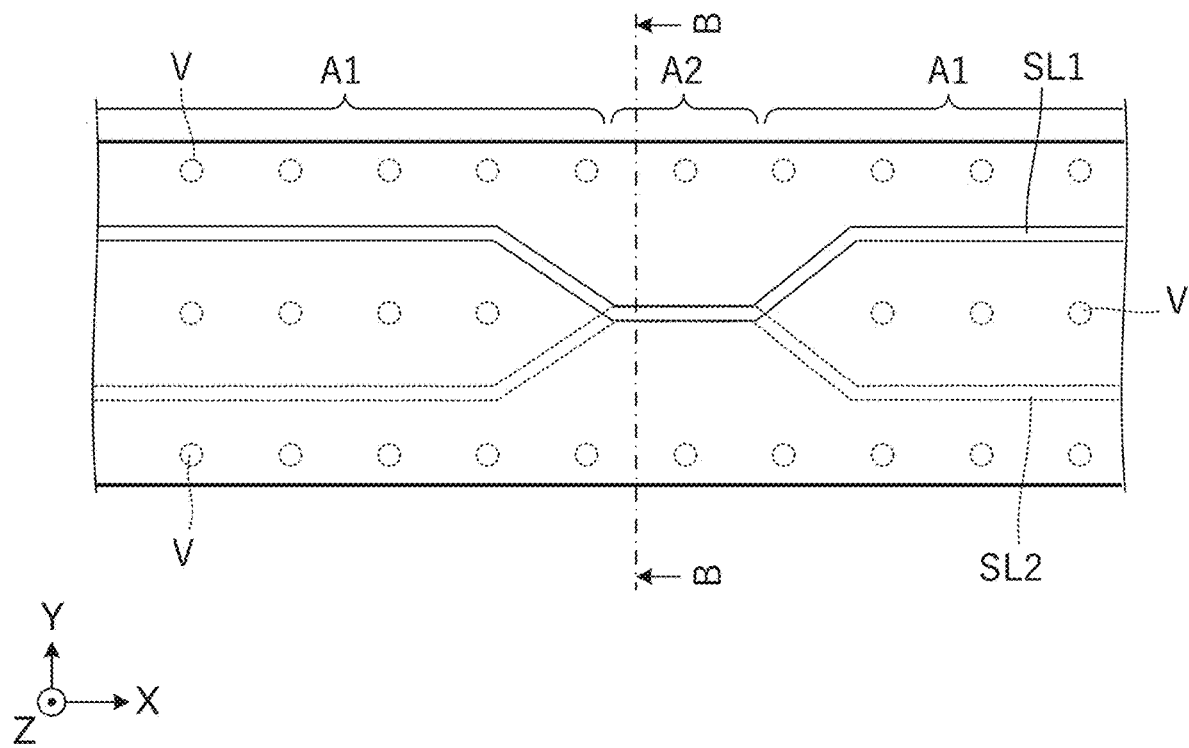
FIG. 13A is a plan view of a predetermined base material of a flexible substrate according to a fifth preferred embodiment of the present invention, and is, in particular, a plan view of a region in which a directional coupler is provided.
Figure 13B:
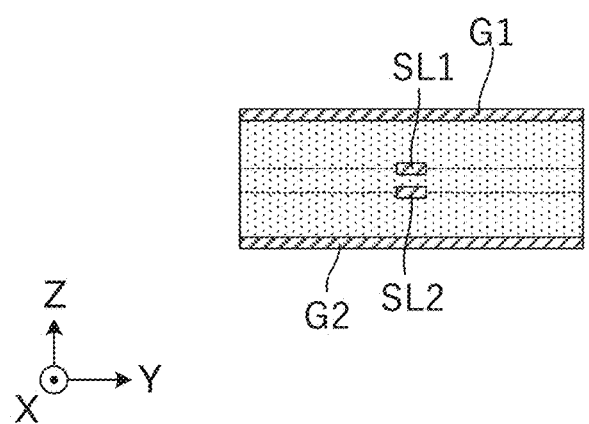
FIG. 13B is a cross-sectional view taken along a line B-B in FIG. 13A.

FIG. 13A is a plan view of a base material of a flexible substrate according to the fifth preferred embodiment of the present invention, and is, in particular, a plan view of a region in which a directional coupler is provided. FIG. 13B is a vertical cross-sectional view of the flexible substrate according to the fifth preferred embodiment, and is a cross-sectional view taken along a line B-B in FIG. 13A.

Although the first preferred embodiment and the fourth preferred embodiment have described examples in which the first line pattern SL1 and the second line pattern SL2 are provided on the same base material, in the example shown in FIGS. 13A and 13B, the first line pattern SL1 and the second line pattern SL2 are provided on different base materials. Then, in the coupled line portion A2, the first line pattern SL1 and the second line pattern SL2 are close to each other in the stacking direction of the base material. The distance between the first line pattern SL1 and the second line pattern SL2 in the coupled line portion A2 is smaller than the distance between the first line pattern SL1 and the second line pattern SL2 in the transmission line portion A1.

According to the present preferred embodiment of the present invention, the dimension in the width direction (the line space direction, the line width direction) of the flexible substrate is able to be reduced.

Sixth Preferred Embodiment

A sixth preferred embodiment of the present invention describes another structural example of a directional coupler provided in a flexible substrate.

Figure 14A:
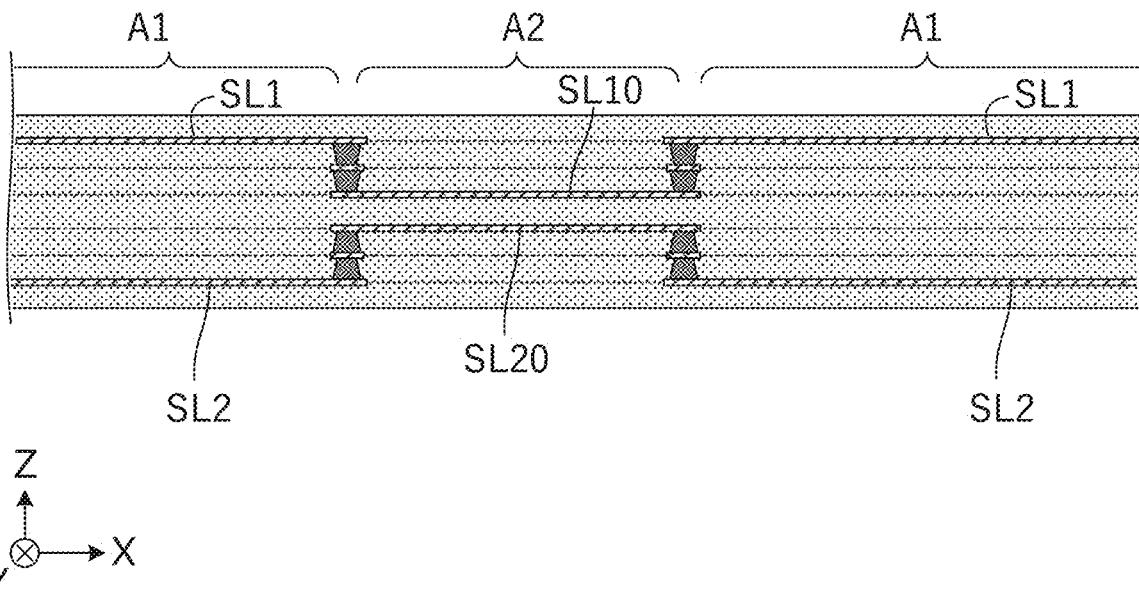
FIGS. 14A and 14B are vertical cross-sectional views of a region in which a directional coupler of a flexible substrate according to a sixth preferred embodiment of the present invention is provided.
Figure 14B:
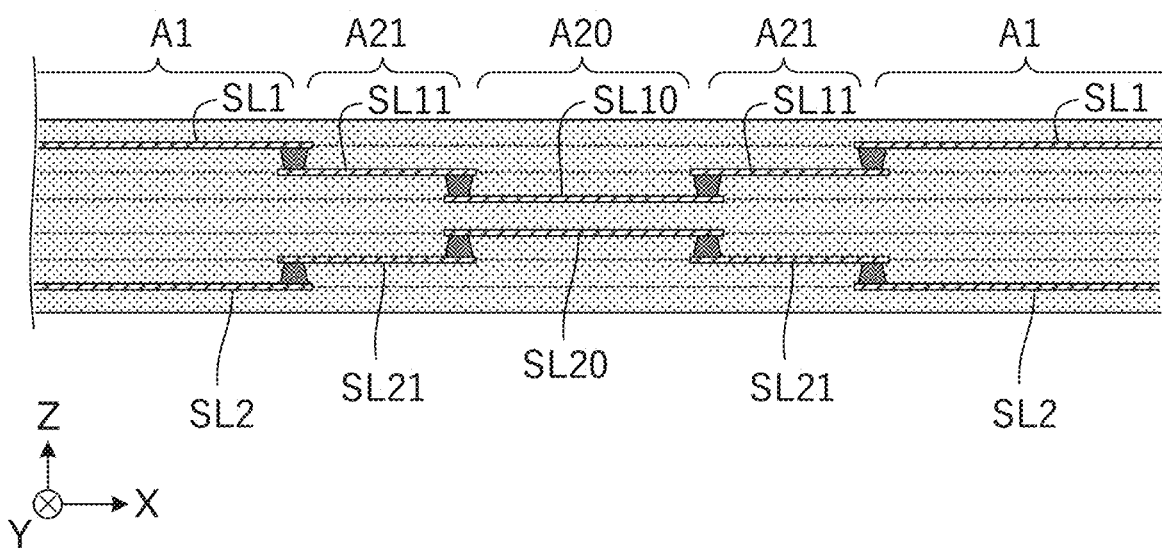

FIGS. 14A and 14B are vertical cross-sectional views of a region in which a directional coupler of a flexible substrate according to the sixth preferred embodiment of the present invention is provided.

In the example shown in FIG. 14A, first line patterns SL1 and SL10, and second line patterns SL2 and SL20 are provided in the inside of the stacked body of a plurality of base materials. The first line pattern SL1 and the first line pattern SL10 are connected to each other through a via conductor. Similarly, the second line pattern SL2 and the second line pattern SL20 are connected to each other through a via conductor. The first line pattern SL10 and the second line pattern SL20 are close to each other in the stacking direction. The distance between the first line pattern SL10 and the second line pattern SL20 is smaller than the distance between the first line pattern SL1 and the second line pattern SL2 in the transmission line portion A1. The line length of the first line pattern SL10 and the second line pattern SL20 is about a quarter wavelength of a wavelength of a signal that propagates through the first line patterns SL1 and SL10 and the second line patterns SL2 and SL20. However, a deviation due to a measurement error or the like is allowed. An area in which the first line pattern SL10 and the second line pattern SL20 are provided corresponds to a coupled line portion A2. According to such a structure, the coupled line portion A2 defines and functions as a directional coupler.

In the example shown in FIG. 14B, first line patterns SL1, SL10, and SL11 and second line patterns SL2, SL20, and SL21 are provided in the inside of the stacked body of a plurality of base materials. The first line pattern SL1 and the first line pattern SL11 are connected to each other through a via conductor. In addition, the first line pattern SL11 and the first line pattern SL10 are connected to each other through a via conductor. Similarly, the second line pattern SL2 and the second line pattern SL21 are connected to each other through a via conductor, and the second line pattern SL21 and the second line pattern SL20 are connected to each other through a via conductor. The first line pattern SL11 and the second line pattern SL21 are close to each other in the stacking direction. The first line pattern SL10 and the second line pattern SL20 are closer to each other in the stacking direction. The line length of the first line pattern SL10 and the second line pattern SL20 is about a quarter wavelength of a wavelength of a signal that propagates through the first line patterns SL1 and SL10 and the second line patterns SL2 and SL20. In addition, the line length of the first line pattern SL11 and the second line pattern SL21 is also about a quarter wavelength. However, a deviation due to a measurement error or the like is allowed. An area in which the first line pattern SL10 and the second line pattern SL20 are provided corresponds to a coupled line portion A20, and an area in which the first line pattern SL11 and the second line pattern SL21 are provided corresponds to a coupled line portion A21. According to such a structure, the coupled line portions A20 and A21 that are coupled in multiple stages defines and functions as a directional coupler.

The description of the above preferred embodiments is illustrative in all respects, but is not restrictive. Modifications and changes are able to appropriately be made by those skilled in the art. The scope of the present invention is defined not by the foregoing preferred embodiments but by the scope of the claims. Further, the scope of the present invention includes modifications of the preferred embodiments within the scope equivalent to the scope of the patent claims.

For example, although the above examples have described that the length of the portion in which the first line pattern SL1 and the second line pattern SL2 are close to each other in the coupled line portion A2 is about a quarter wavelength of the wavelength of a signal that propagates through the first line pattern SL1 and the second line pattern SL2, the special high accuracy is not necessarily required. Even when the length is not about a quarter wavelength, the electric power proportional to the electric power outputted to an antenna or the like according to the degree of coupling in the coupled line portion is able to be detected.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A flexible substrate comprising:
   a base substrate that has flexibility;
   a connecting portion on the base substrate and connectible to a mounted circuit; and
   a first line and a second line at the base substrate and connected to the connecting portion; wherein
   the first line and the second line include:
      a first region in which the first line and the second line extend in parallel or substantially in parallel with each other; and
      a second region in which the first line and the second line are closer to each other than in the first region and coupled to each other; and
   a length of each of the first line and the second line in the second region is equal or substantially equal to one quarter of a wavelength of a signal that propagates through the first line and the second line.

2. The flexible substrate according to claim 1, wherein the base substrate includes a stacked body including a plurality of insulating base material layers stacked on each other; and
   a thickness of the second region is larger than a thickness of the first region.

3. The flexible substrate according to claim 1, wherein a distance between the first line and the second line in the second region varies in stages.

4. The flexible substrate according to claim 1, wherein the base substrate includes an antenna portion electrically connected to the first line or the second line.

5. The flexible substrate according to claim 1, wherein the first region includes a bent portion.

6. The flexible substrate according to claim 1, wherein, in a direction in which the first line and the second line extend, the first region is disposed on each side of the second region.

7. The flexible substrate according to claim 1, wherein the first line and the second line are disposed on different layers of the base substrate.

8. An electronic device comprising:
   the flexible substrate according to claim 1;
   a first mounted circuit; and
   a second mounted circuit; wherein
   the first mounted circuit and the second mounted circuit are connected to each other through the flexible substrate;
   the connecting portion includes:
      a first connecting portion connected to the first mounted circuit; and
      a second connecting portion connected to the second mounted circuit;
   the first line is connected to the first connecting portion; and
   the second line is connected to the second connecting portion.

9. The electronic device according to claim 8, wherein the first mounted circuit is an antenna substrate including an antenna; and
   the second mounted circuit is a circuit substrate.

10. The electronic device according to claim 9, wherein the second region is closer to the antenna substrate than to the circuit substrate.

11. A flexible substrate comprising:
    a base substrate that has flexibility;
    a connecting portion on the base substrate and connectible to a mounted circuit; and
    a first line and a second line at the base substrate and connected to the connecting portion; wherein
    the first line and the second line include:
       a first region in which the first line and the second line extend in parallel or substantially in parallel with each other; and
       a second region in which the first line and the second line are closer to each other than in the first region and coupled to each other; and
    the first region includes an interlayer connection conductor between the first line and the second line.

12. The flexible substrate according to claim 11, wherein the base substrate includes a stacked body including a plurality of insulating base material layers stacked on each other; and
    a thickness of the second region is larger than a thickness of the first region.

13. The flexible substrate according to claim 11, wherein a distance between the first line and the second line in the second region varies in stages.

14. The flexible substrate according to claim 11, wherein the base substrate includes an antenna portion electrically connected to the first line or the second line.

15. A flexible substrate comprising:
    a base substrate that is at least partially bent;
    a connecting portion on the base substrate and connectible to a mounted circuit; and
    a first line and a second line at the base substrate and connected to the connecting portion; wherein the first line and the second line include:
- a first region in which the first line and the second line extend in parallel or substantially in parallel with each other; and
- a second region in which the first line and the second line extend in parallel or substantially in parallel with each other; and a maximum distance between the first line and the second line in the second region is smaller than a maximum distance between the first line and the second line in the first region.

16. An electronic device comprising:

the flexible substrate according to claim 15;

a first mounted circuit; and a second mounted circuit; wherein the first mounted circuit and the second mounted circuit are connected to each other through the flexible substrate.

17. The electronic device according to claim 16, wherein
- the first mounted circuit is an antenna substrate including an antenna; and
- the second mounted circuit is a circuit substrate.

18. The electronic device according to claim 17, wherein the second region is closer to the antenna substrate than to the circuit substrate.

19. The flexible substrate according to claim 15, wherein
- the base substrate includes a stacked body including a plurality of insulating base material layers stacked on each other; and
- a thickness of the second region is larger than a thickness of the first region.

20. The flexible substrate according to claim 15, wherein a distance between the first line and the second line in the second region varies in stages.

21. The flexible substrate according to claim 15, wherein the base substrate includes an antenna portion electrically connected to the first line or the second line.

* * * * *